United States Patent [19]

Monden

[11] Patent Number: 5,640,358
[45] Date of Patent: Jun. 17, 1997

[54] BURST TRANSMISSION SEMICONDUCTOR MEMORY DEVICE

[75] Inventor: Junji Monden, Tokyo, Japan

[73] Assignee: NEC Corporation, Tokyo, Japan

[21] Appl. No.: 561,880

[22] Filed: Nov. 22, 1995

[30] Foreign Application Priority Data

Nov. 22, 1994 [JP] Japan .................................. 6-287752

[51] Int. Cl.$^6$ ...................................................... G11C 8/00
[52] U.S. Cl. ..................... 365/230.06; 365/233; 365/239; 365/230.04
[58] Field of Search ............................... 365/230.06, 233, 365/239, 240, 230.04

[56] References Cited

U.S. PATENT DOCUMENTS 5,392,239  2/1995  Margulis ................................. 365/233
5,487,049  1/1996  Hang ....................................... 365/239

*Primary Examiner*—David C. Nelms
*Assistant Examiner*—Huan Hoang
*Attorney, Agent, or Firm*—Young & Thompson

[57] ABSTRACT

A semiconductor memory device includes a burst decode signal generation circuit including a bi-directional loop shift register, an input register corresponding to configuration bits outputted from the first first-order decoder, in which the register captures the corresponding configuration bits, so as to subject each of the configuration bits outputted from the first first-order decoder to a circulation shift by synchronizing with the internal address progress clock in a predetermined direction in accordance with an initial address of the first bits of the address signals, and an initial address even/odd judgment section for judging whether the initial address is even or odd, a plurality of input registers, each of which captures decoded signals outputted from the second first-order decoder in an initial value capturing internal clock, a main decoder which decodes outputs from the input registers and the burst decode signal generation circuit for subsequent output of address selective signals, and a memory cell array section which shows read/write operations of data at an address selected in accordance with the address selective signal.

3 Claims, 10 Drawing Sheets

|  | | initial | 1st burst | 2nd burst | 3rd burst | 4th burst |
|---|---|---|---|---|---|---|
| CV1–CV0 | | 00 | 01 | 10 | 11 | 00 |
| ai–a0 | 00 | 00 | 01 | 10 | 11 | 00 |
|  | 01 | 01 | 00 | 11 | 10 | 01 |
|  | 10 | 10 | 11 | 00 | 01 | 10 |
|  | 11 | 11 | 10 | 01 | 00 | 11 |

| ai–a0 | initial | 1st burst | 2nd burst | 3rd burst | 4th burst |
|---|---|---|---|---|---|
| 00 | db0 | db1 | db2 | db3 | db0 |
| 01 | db1 | db0 | db3 | db2 | db1 |
| 10 | db2 | db3 | db0 | db1 | db2 |
| 11 | db3 | db2 | db1 | db0 | db3 |

FIG. 4B

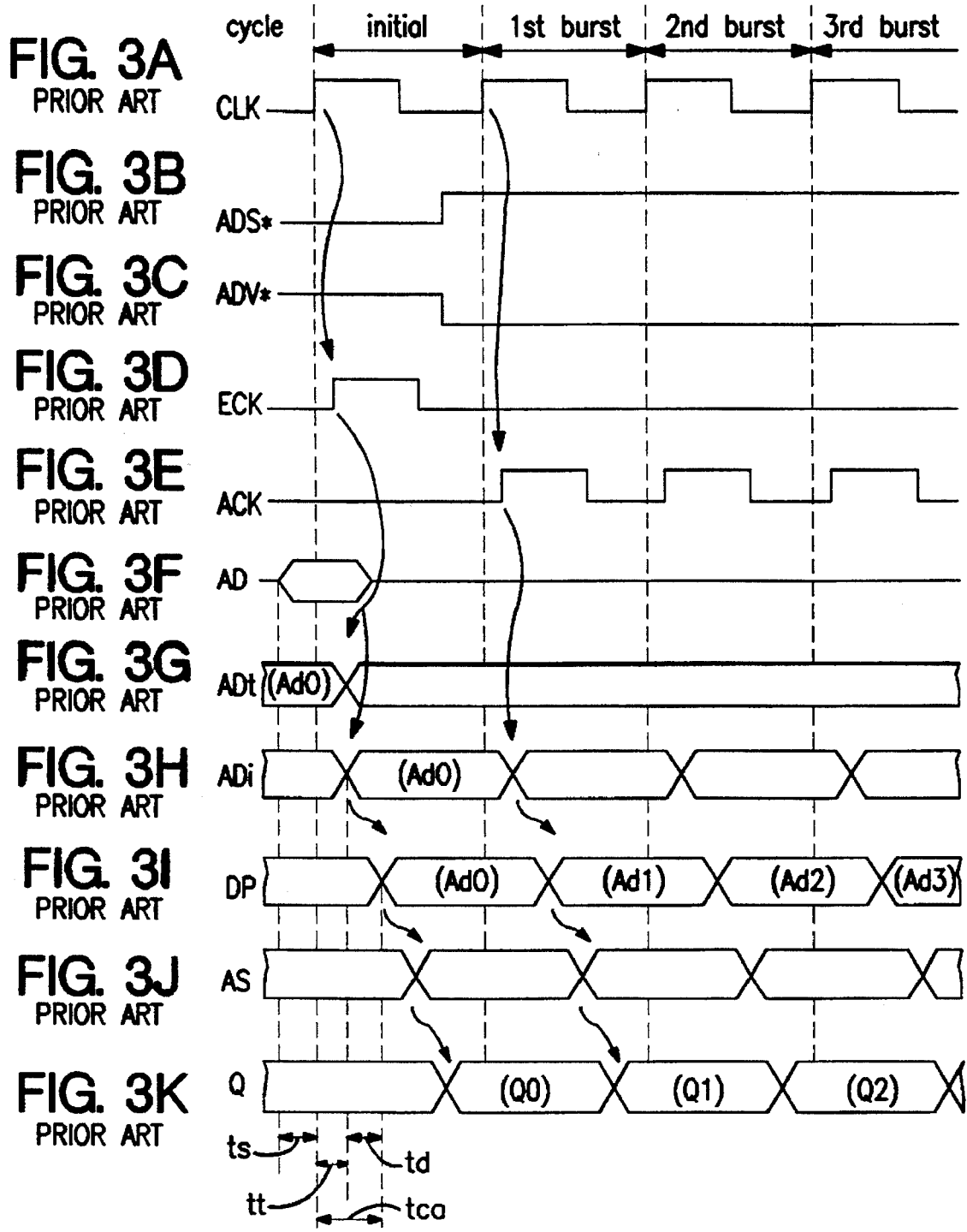

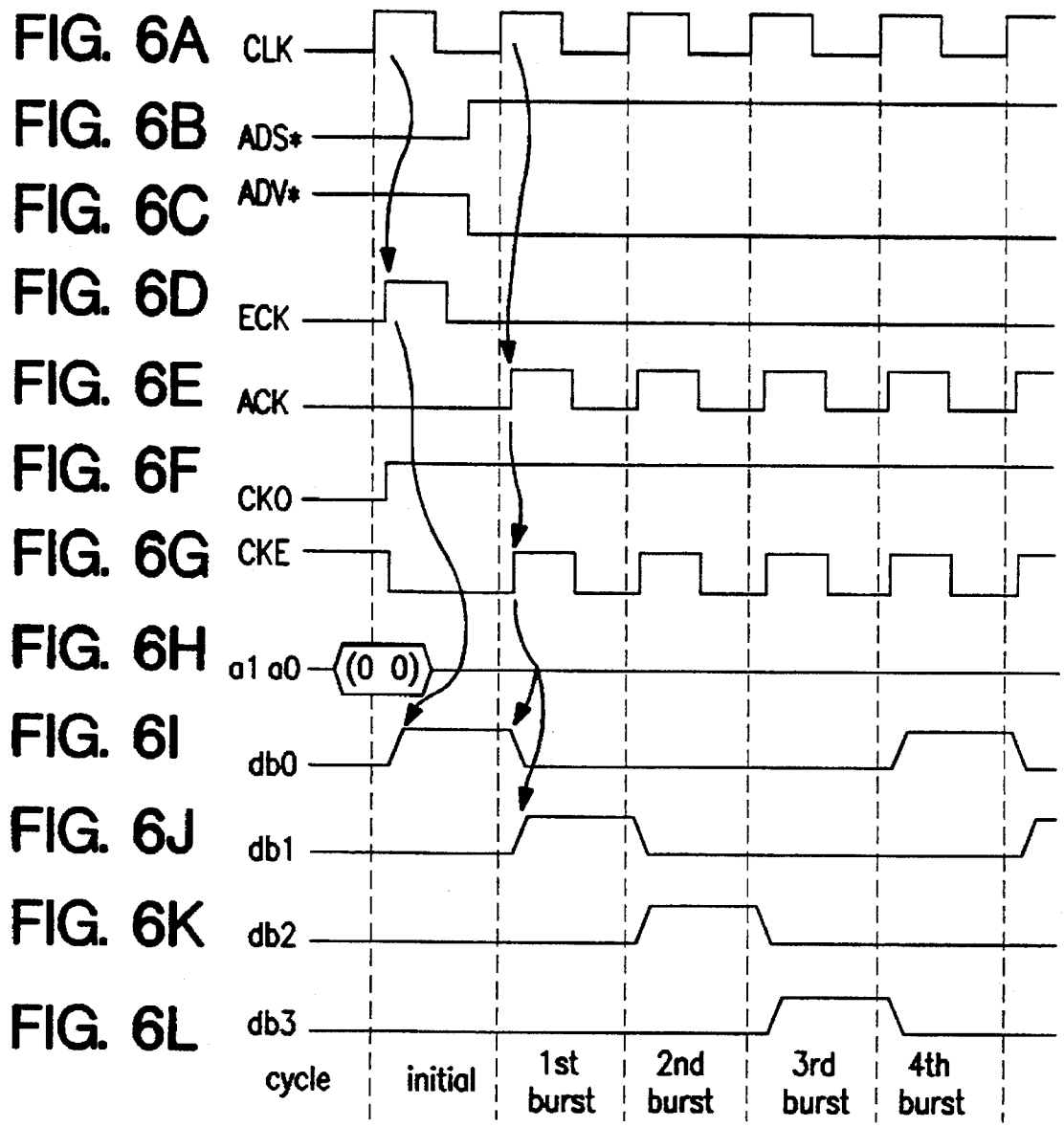

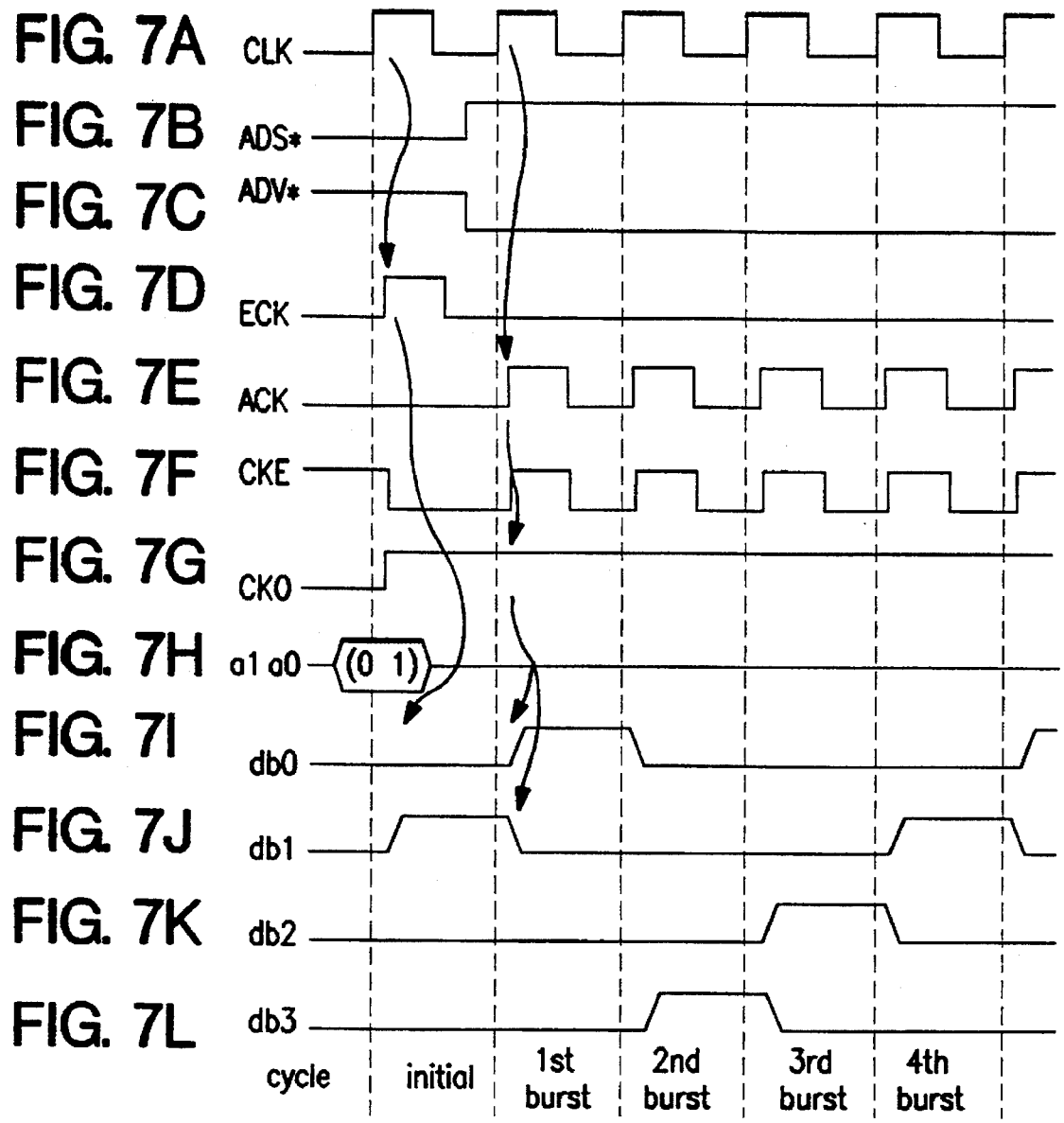

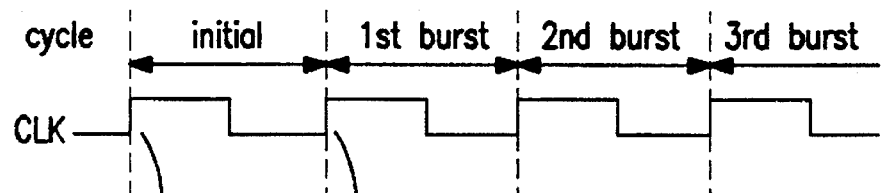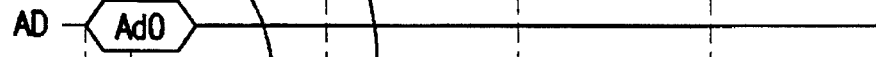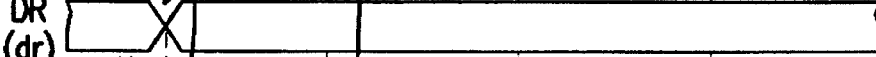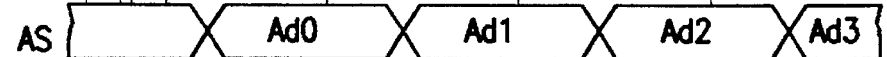

BURST TRANSMISSION SEMICONDUCTOR MEMORY DEVICE

BACKGROUND OF THE INVENTION

1. Field of the Invention

The present invention relates to a semiconductor memory device, and more particularly to a semiconductor burst transmission memory device which conducts sequential accesses to a plurality of addresses including an initial address.

2. Background of the Invention

The semiconductor memory devices has been often used as an external memory for microprocessor. When the microprocessor accesses to the external memory device, then data transmissions are carried out for every unit, each of which corresponds to a bit width of an input/output bus. When the microprocessor sends the request of data to the external memory device, the unit may often correspond to four times or eight times of the bit width of the input/output bus. In such case, the access is repeated four times or eight times in accordance with the regulated address sequences. This data transmission is named as "burst transmission". A burst RAM semiconductor memory device is synchronous with mid responsible for the burst transmission. The burst RAM captures an external address signal by synchronizing with the reference clock during an initial cycle for subsequent output of data in accordance with the addresses. In the later sequential cycles, the burst RAM generates an internal address being regularly changed, by synchronizing with the reference clock, from the external address captured in the initial cycle. Such burst RAM is described in detail with reference to the drawings.

FIG. 1 is illustrative of a configuration of the burst RAM wherein a burst length or the number of data address to be subjected to the burst transmission is "4". FIG. 1B is a table showing an internal address signal value to be inputted into a first-order decoder, The burst RAM has an external clock generator circuit 2 which receives the following three signals. The first signal is the reference clock CLK. The second signal is the initial address detection signal ADS* for an initial address detection of the address signal externally inputted, wherein the address signal comprises configuration bits a0, a1, . . . , an. The mark "*" represents a low level active state. The third signal is the address progress signal ADV* which represents the update progress period of address from an initial address of the address progress signals. The external clock generator circuit 2 generates an initial value capturing internal clock ECK and an internal address progress clock ACK.

The burst RAM also has a plurality of input registers 4 which store corresponding configuration bits m accordance with the initial value capturing internal clock ECK, wherein the corresponding configuration bits correspond to the configuration bits of the address signal.

The burst RAM also has an internal address generating circuit 7 which includes a binary counter 71, a logic gate G71 and a logic gate G72. The binary counter 71 generates binary count signals CV1, CV0 corresponding to values being sequentially updated by synchronizing with the internal address progress clock ACK wherein the binary count signals CV1, CV0 are initialized by the initial value capturing internal clock ECK. The logic gate G71 comprises an exclusive OR gate of the configuration bit a0 of the address signal AD and the count signal CV0. The logic gate G72 comprises an exclusive OR gate of the configuration bit a1 of the address signal AD and file count signal CV1. The internal address generating circuit 7 generates the internal address signals ai1, ai0 associated with the internal address being sequentially updated by synchronizing with the internal address progress clock ACK.

The burst RAM also has a first first-order decoder 11, which is adopted to decode the internal address signals ail, ai0, and a plurality of second first-order decoders 12, each of which decodes, for every predetermined bit, the address-signal-corresponding output signals from the input registers 4. The burst RAM also has a main decoder 5 which decodes the outputs from the first and second first-order decoders 11 and 12 and then outputs an address selecting signal AS.

The burst RAM also has a memory cell array sect/on 6 which writes and reads out the data in accordance with the address selected by the address selecting signal AS.

In the configuration bits of the address signals AD, a0 and a1 are the address signals associated with the burst operations. The reference clock, the initial address detection signals ADS* and the address progress signal ADV* are inputted into the internal clock generation circuit 2. As a result, the internal clock generation circuit 2 generates the initial value capturing internal clock ECK and the internal address progress clock ACK.

FIG. 2A is illustrative of the circuit configuration of the internal clock generation circuit 2. When the initial address detection signals ADS* is in the low level, the initial value capturing internal clock ECK is synchronous to the reference clock CLK and the internal address progress clock ACK is fixed at the low level. If the initial address detection signals ADS* is in the high level and the address progress signal ADV* is in the low level, then the internal address progress clock ACK is synchronous to the reference clock CLK and the initial value capturing internal clock ECK is fixed at the low level. If the initial address detection signals ADS* and the address progress signal ADV* are in the high level, then the initial value capturing internal clock ECK and the internal address progress clock ACK are fixed at the low level.

FIG. 2B is illustrative of the circuit configuration of the input register 4 which comprises two stage of flip-flop circuits, or the first stage IV41, IV42 and the second stage IV43, IV44.

During the time when the initial value capturing internal clock ECK is in the low level, the address signal a0 is transmitted to the first stage flip-flop circuits. Just when the initial value capturing internal clock ECK assumes a high level, the address signal information is latched and simultaneously transmitted to the seemed stage flip-flop circuits. At this time, the internal address signal ar0 is determined. When the initial value capturing internal clock ECK is made into the low level, the internal address signal ar0 is latched. The address signal ar1 is dealt with in the same manner. The address signals a2–an are inputted into the input register 4 and then treated in the same manner.

The address signals ar0 and ar1, from the input register 4 which decides the burst initial address, are respectively subjected to the exclusive logical add with bits which correspond to the count signals CV0, CV1 from the binary counter 71 for subsequent input as the internal address signals ai0, ai1 into the first first-order decoder 11. The initial value capturing internal clock ECK is inputted into the binary counter 71 as the reset clock. The internal address progress clock ACK is inputted into the binary counter 71 as the count-up clock. In the initial cycle, during which the external address signal AD is captured, the initial value capturing internal clock ECK becomes the high level as well as the count signals CV1, CV0 become "00". As a result, the internal address signals ai0, ai1 become the same as the address signals a0, a1. In the subsequent burst cycle, during which the internal address is progressed, the internal address progress clock ACK is generated. The count signals CV1, CV0 are counted up in the order of 00→01→10→11→00. Depending on the changes in the output of the binary counter 71, the internal address signals ai1, ai0 corresponding to the address signals a1, a0 are changed as illustrated in FIG. 1B.

The internal address signals ai0, ai1 are decoded by the first first-order decoder 11 illustrated in FIG. 2C. The internal address signals ar2-arn from the corresponding input registers 4 are decoded for predetermined bits by the second first-order decoder 12 for subsequent input into the main decoder 5. The outputs of the first and second first-order decoders 11 and 12 are decoded by the main decoder 5 and then supplied to the memory cell array section 6 as the address selective signal AS. The memory cell array section 6 accesses to the address selected in accordance with the address selective signal AS. Data from four addresses be sequentially updated are sequentially updated. The external data DI arc sequentially written at the four addresses.

FIG. 3 is a timing chart illustrative of the burst operation. In the initial cycle, the initial address detection signal ADS* is in the low level while the initial value capturing internal clock ECK becomes the high level by synchronizing with the reference clock CLK, thereby fie external address signal AD with an address value of Ad0 is captured into the input register 4. Simultaneously, the external address signal AD is subjected to the exclusive logical add with the output of the binary counter 71 reset by the initial value capturing internal clock ECK so as to set the internal address signal Adi at the same value Ad0 as the address signal AD. This signal is transmitted through the first and second first-order decoders 11 and 12 and the main decoder 5 to thereby select a memory cell at the specific address. The selected data Q0 is then outputted. In the burst cycle following to the initial cycle, the address progress signal ADV* is set at the low level while the initial address detection signals ADS* is set at the high level, thereby the internal address progress clock ACK is generated by synchronizing with the reference clock CLK. As a result, the counter signals CV0, CV1 as the outputs of file binary counter 71 are changed so that the internal address is changed from Ad0 to Ad1 in a first burst step. Thus, the selected memory cell is changed and the data Q1 is outputted. These operations are repeated so that by giving one address only file data at four different addresses are synchronized with the reference clock CLK for subsequent output thereof.

The address signal is set rapidly for a time duration, named as set-up time "ts", immediately after the reference clock CLK is raised. The time duration of "tr" is necessary for setting the internal address to be inputted into the first and second first-order decoders 11 aid 12. The first and second first-order decoders 11 and 12 have the delay times td. The main decoder 5 also has a delay time. The data Q is outputted from the memory cell array section 6 after the delay times. The time duration from the raising of the reference clock CLK to the output of file data Q is named as a clock access time "tca". In this case, the interleave system is used where the outputs of the binary counter 71 CV0, CV1 are subjected to file exclusive logical add with the outputs ar0, ar1 of the input register 4 to determine the burst address. When the initial address is even, then the burst address is ascending order. When the initial address is odd, then the burst address is descending order. In the burst system, there is a linear system where the burst address is always ascending order. The linear system can be configured by replacing the exclusive OR gates G71 and G72 of the internal address generation circuit 7 by the adders.

According to the conventional semiconductor device described above, the address signal AD is captured into the input register 4 to be stored, thereby generating the internal address signal Adi of each of the burst cycles. The address of the memory cell array section 6 is selected in accordance with the address selective signal AS generated via the first and second first-order decoders 11, 12 and the main decoder 5. The operation times for the input register 4, the internal address generation circuit 7, the first and second first-order decoders 11, 12 and the main decoder 5 are sequentially added. For that reason, the clock access time tca defined as a time from the raising of the reference clock CLK to the output of the data Q is necessarily long. This means it is hard to show a high speed operation. The configuration element of the internal address generation circuit is different between the interleave system and the linear system. When the memory device is designed to be responsible for both the systems, then the number of elements thereof is increased.

SUMMARY OF THE INVENTION

Accordingly, it is an object of the present invention to provide a semiconductor memory device which shows a high speed operation due to a shortened clock access time.

It is a further object of the present invention to provide a semiconductor memory device with a small number of additional elements which enable the memory device to be responsible for both an interleave system and a linear system.

The above and other objects, features and advantages of the present invention will be apparent from the following description.

According to the present invention, a novel memory device is provided with a first first-order decoder which decodes a predetermined number of first bits among address signals inputted. There is provided a second first-order decoder which decodes a predetermined number of second bits other than the first bits m the address signals inputted. Them is also provided a bi-directional loop shift register burst decode signal generation circuit which subjects each of the configuration bits outputted from the first first-order decoder to a circulation shift in a predetermined direction in accordance with an initial address of the first bits of the address signals. There is provided an input register which captures decoded signals outputted from the second first-order decoder in a predetermined timing. There is provided a main decoder which decodes outputs from the input register and file burst decode signal generation circuit for subsequent output of address selective signals. There is further provided a memory cell array section which carries out read/write operations of data at an address selected in accordance with the address selective signal According to the present invention, a novel memory device is provided with a first first-order decoder which decodes a predetermined number of first bits among address signals inputted. There is provided a second first-order decoder which decodes a predetermined bit number of second bits other than the first bits in the address signals inputted. There is also provided an internal clock generation circuit which receives a reference clock, an initial address detection signal for detecting an initial address of the address signals and an address progress signal indicating an up-dating progress time period to an address front the initial address for subsequent generations of an initial value capturing internal clock and an internal address progress clock. There is further provided a burst decode signal generation circuit with a bi-directional loop shift register including registers corresponding to configuration bits outputted from the first first-order decoder, in which the registers capture the corresponding configuration bits so as to subject each of the configuration bits outputted from the first first-order decoder to a circulation shift by synchronizing with the internal address progress clock in a predetermined direction in accordance with an initial address of the first bits of the address signals. There is provided an input register which captures decoded signals outputted from the second first-order decoder in a predetermined timing. There is provided a main decoder which decodes outputs from the input register and the burst decode signal generation circuit for subsequent output of address selective signals. There is further provided a memory cell array section which shows read/write operations of data at an address selected in accordance with the address selective signal.

The burst decode signal generation circuit is designed so that when an initial address of the first bit of the address signals is even, then the circulation shift is carried out in the reverse direction.

In the burst decode signal generation circuit, there may be provided an input register which captures the configuration bits outputted from the first first-order decoder in accordance with the initial value capturing internal clock. There may further be provided an initial address even/odd judgment section for judging whether the initial address of the first bits of the address signals with respect to the output from the input register.

BRIEF DESCRIPTIONS OF THE DRAWINGS

Preferred embodiments of the present invention will be described in detail with reference to the accompanying drawings.

FIG. 1B is a view illustrative of address signal values to be inputted into a first first-order decoder.

FIG, 2B is a circuit diagram illustrative of an input register.

Figure 1A:
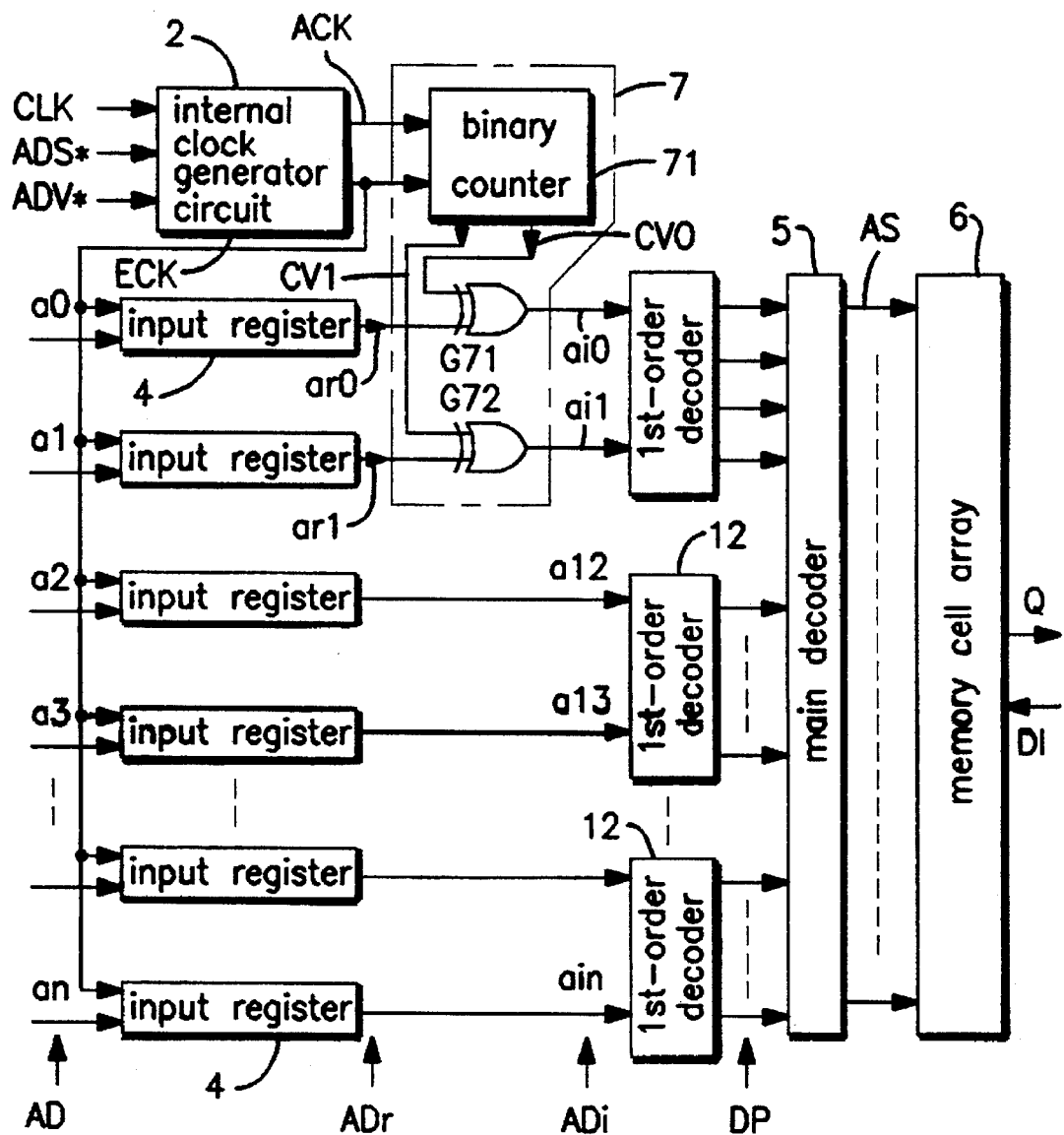
FIG. 1A is a circuit diagram illustrative of a conventional memory device.
Figure 2A:
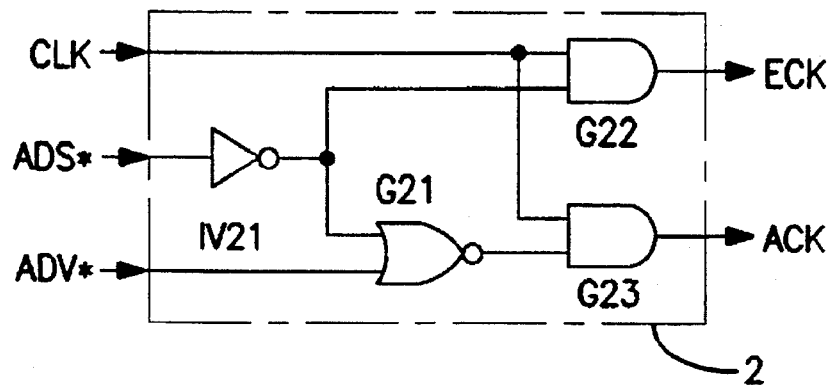
FIG. 2A is a circuit diagram illustrative of an internal clock generation circuit.
Figure 2B:
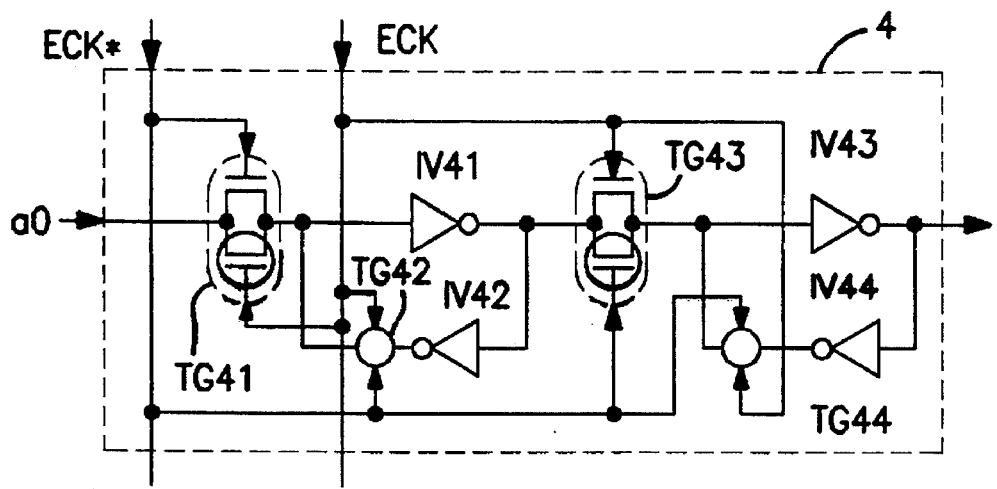
Figure 2C:
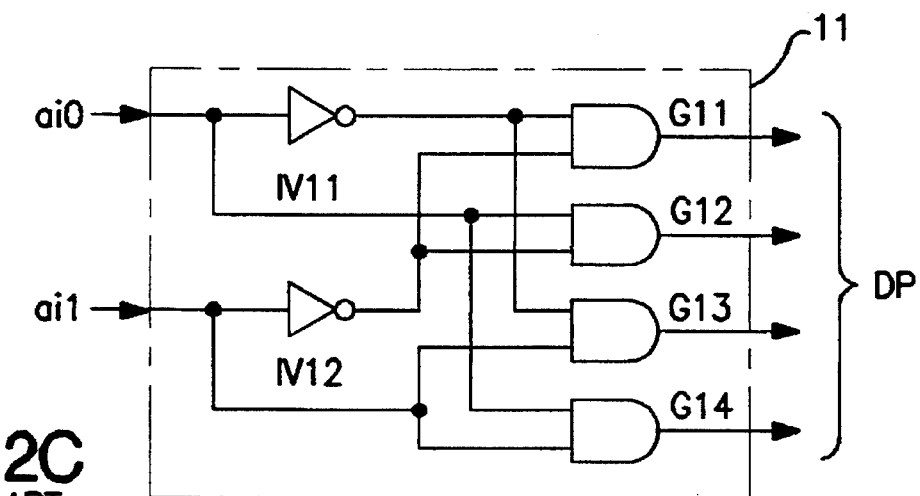

FIG. 2C is a circuit diagram illustrative of a first-order decoder.

FIG. 3 is a timing chart illustrative of operations of the conventional memory device.

Figure 4A:
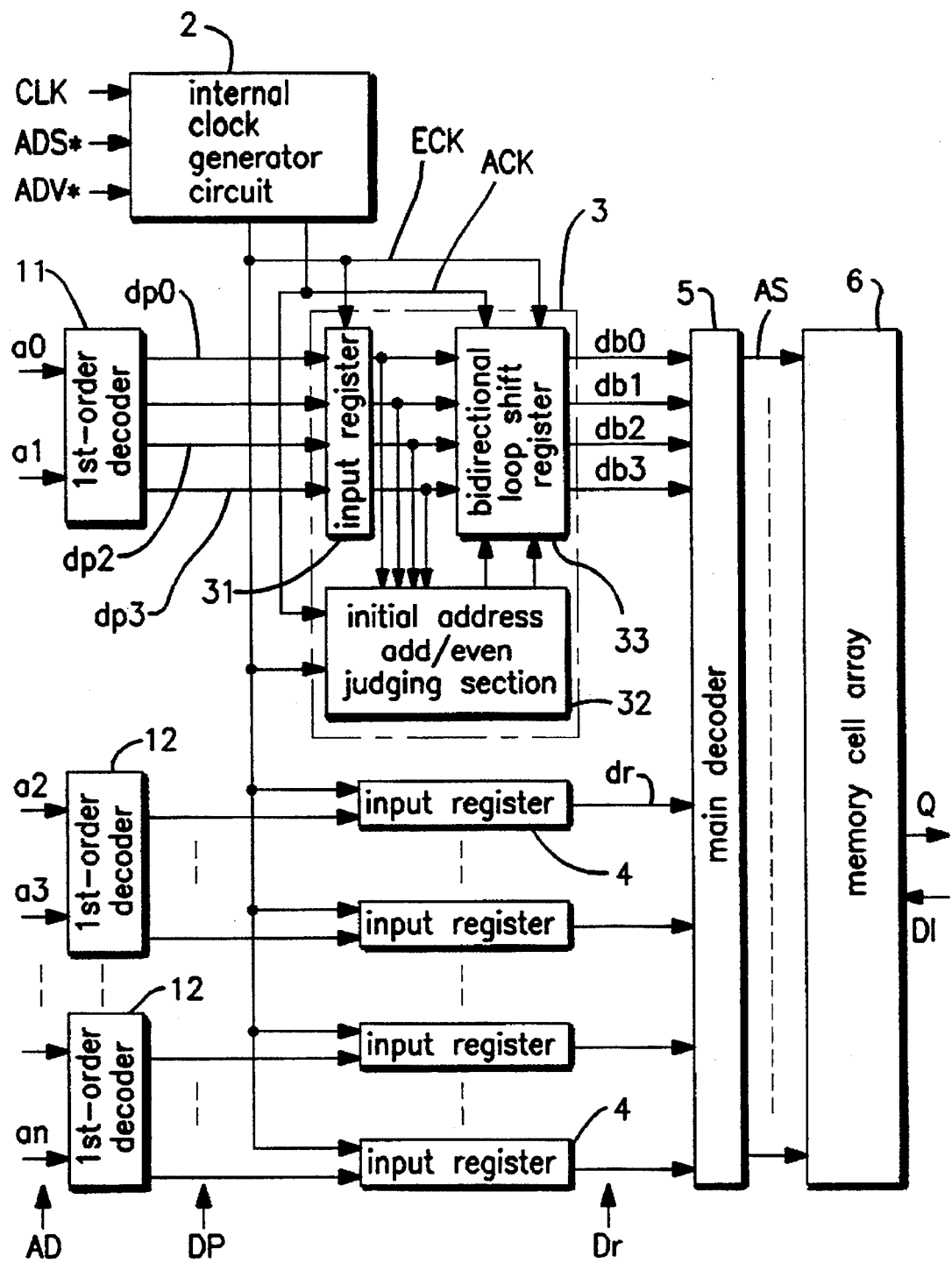

FIG. 4A is a circuit diagram illustrative of a novel memory device according to the present invention.

FIG. 4B is a view illustrative of initial address and outputs to explain operations of a burst decode signal generation circuit according to the present invention.

Figure 5:
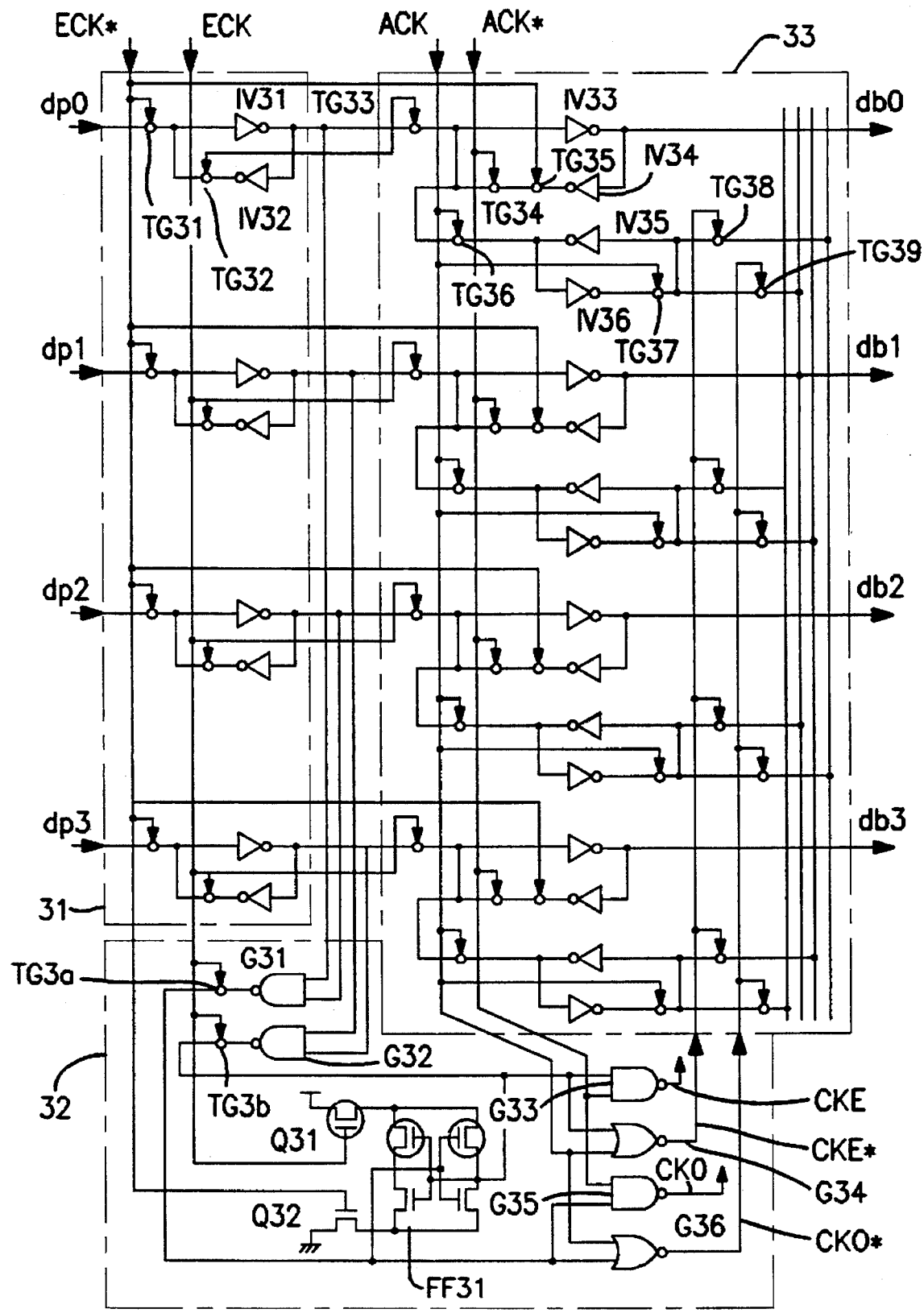

FIG. 5 is a circuit diagram illustrative of a burst decode signal generation circuit according to the present invention.

FIG. 6 is a timing chart illustrative of operations of a novel memory device when an initial address is even according to the present invention.

FIG. 7 is a timing chart illustrative of operations of a novel memory device when an initial address is odd according to the present invention.

FIG. 8 is a timing chart illustrative of operations of a novel memory device according to the present invention.

Figure 9:
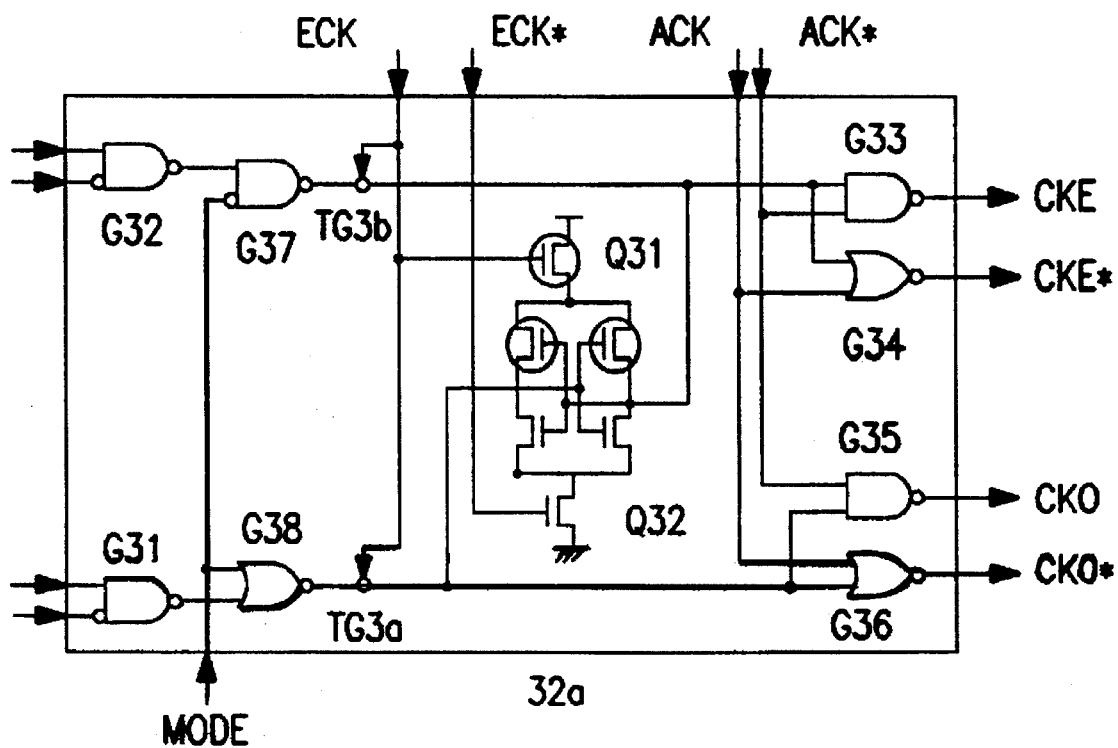

FIG. 9 is a circuit diagram illustrative of an initial address even/odd judgment section according to the present invention.

EMBODIMENTS

A first embodiment according to the present invention will be described. A novel memory device illustrated in FIG. 4A is provided with a first first-order decoder 11 which decodes a predetermined number of first bits among address signals inputted. There is provided a second first-order decoder 12 which decodes a predetermined number of second bits other than the first bits in the address signals inputted. There is also provided an internal clock generation circuit 2 which receives a reference clock CLK, an initial address detection signal ADS* for detecting an initial address of the address signals and an address progress signal ADV* indicating an up-dating progress time period to an address from the initial address for subsequent generations of an initial value capturing internal clock and an internal address progress clock. There is further provided a burst decode signal generation circuit 3 including a bi-directional loop shift register 33, an input register 31 corresponding to configuration bits outputted from the first first-order decoder, in which the register 31 capture the corresponding configuration bits so as to subject each of the configuration bits outputted from the first first-order decoder to a circulation shift by synchronizing with the internal address progress clock in a predetermined direction in accordance with an initial address of the first bits of the address signals, and an initial address even/odd judgment section 32 for judging whether the initial address is even or odd. There are provided a plurality of input registers 4 each of which captures decoded signals outputted from the second first-order decoder in an initial value capturing internal clock ECK. There is provided a main decoder 5 which decodes outputs from the input registers 4 and the burst decode signal generation circuit 3 for subsequent output of address selective signals. There is further provided a memory cell array section 6 which shows read/write operations of data at an address selected in accordance with the address selective signal.

The burst decode signal generation circuit is illustrated in FIG. 5 and is so designed that when an initial address of the first bit of the address signals is even, then the circulation shift is carried out in the reverse direction.

The odd address signal clock CKO becomes the same phase lock as ACK when the initial address is odd. The same is fixed at the high level when it is even. CKE becomes the same phase lock as ACK when the initial address is even. The same is fixed at the high level when it is odd. When the initial address is even, the even address progress clock CKE is generated in the same phase as ACK. The signal stored in the bi-directional loop shift register 33 is circulation-shifted in the forward direction. When the initial address is odd, the odd address progress clock CKO is generated in the same phase as ACK. The signal stored in the bi-directional loop shift register 33 is circulation-shifted in the reverse direction.

As illustrated in FIG. 8, the external address signal AD is decoded by the first-order decoders 11, 12 and then transmitted to the burst decode signal generation circuit 3 and the input registers 4. The decode signals dp0–dp3 of the initial address are inputted into the input register 31 of the burst decode signal generation circuit 3 and then transmitted via the second flip-flop circuits IV33, IV34 of the bi-directional loop shift register 33 to the main decoder 5. In the initial cycle, the signal ACK* is the high level and the transfer gate TG34 is conductive. Thus, the register formed of the first and second flip-flop circuits IV31–IV34 are the same as the input registers 4. A time necessary for transmitting the decode signals dp0–dp3 of the first first-order decoder 11 via the burst decode signal generation circuit 3 to the main decoder 5 is identical with a time necessary for transmitting the decode signals of the second fast-order decoder 12 via the input register 4 to the main register 5.

The delay time "td" due to the operation of the first-order decoders 11 and 12 is normally shorter than the set tip time "ts". The delay time "td" can be compensated by the set up time "ts". Accordingly, the clock access time is shortened by the delay time "td".

The initial address even/odd judgment section 32a may have the circuit configuration illustrated in FIG. 9. When file mode signal MODE is the low level, it is responsible for the interleave system. When the mode signal MODE is the high level, it is responsible for the linear system.

What is claimed is:

1. A semiconductor memory device comprising:

a first first-order decoder which decodes predetermined first bits among inputted address signals;

a second first-order decoder which decodes a predetermined number of second bits other than the first bits in the inputted address signals;

an internal clock generation circuit which receives a reference clock, an initial address detection signal for detecting an initial address of the address signals and an address progress signal indicating an up-dating progress time period to an address from the initial address for subsequent generations of an initial value capturing internal clock and an internal address progress clock;

a burst decode signal generation circuit including a bi-directional loop shift register, an input register corresponding to configuration bits outputted from the first first-order decoder, in which the input register captures the corresponding configuration bits, so as to subject each of the configuration bits outputted from the first first-order decoder to a circulation shift by synchronizing with the internal address progress clock in a predetermined direction in accordance with an initial address of the first bits of the address signals, and an initial address even/odd judgment section for judging whether the initial address is even or odd;

a plurality of input registers, each of which captures decoded signals outputted from the second first-order decoder in an initial value capturing internal clock;

a main decoder which decodes outputs from the input registers and the burst decode signal generation circuit for subsequent output of address selective signals; and a memory cell array section which shows read/write operations of data at an address selected in accordance with the address selective signal.

2. The device as claimed in claim 1, wherein the burst decode signal generation circuit is designed so that when an initial address of the first bit of the address signals is even, then the circulation shift is coined out in the reverse direction.

3. The device as claimed in claim 1, wherein the burst decode signal generation circuit comprises:

an input register which captures the configuration bits outputted from the first first-order decoder in accordance with the initial value capturing internal clock; and an initial address even/odd judgment section for judging whether the initial address of the first bits of the address signals is even or odd with respect to the output from the input register.

* * * * *